(12) United States Patent
Iio et al.

(10) Patent No.: US 7,620,284 B2
(45) Date of Patent: Nov. 17, 2009

(54) OPTICAL WAVEFORM SHAPING DEVICE INCLUDING PORTIONS FOR RESPECTIVELY ABSORBING AND AMPLIFYING TRANSMITTED OPTICAL SIGNAL

(75) Inventors: Shinji Iio, Tokyo (JP); Machio Dobashi, Tokyo (JP); Chie Sato, Tokyo (JP); Morio Wada, Tokyo (JP); Katsuya Ikezawa, Tokyo (JP); Akira Miura, Tokyo (JP); Tsuyoshi Yakihara, Tokyo (JP); Shinji Kobayashi, Tokyo (JP); Sadaharu Oka, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 199 days.

(21) Appl. No.: 11/437,647

(22) Filed: May 22, 2006

(65) Prior Publication Data
US 2007/0003202 A1    Jan. 4, 2007

(30) Foreign Application Priority Data
Jul. 1, 2005    (JP)    ............................ P2005-193546

(51) Int. Cl.
*G02B 6/10*    (2006.01)
(52) U.S. Cl. ............................. 385/129; 385/2; 385/3; 385/8; 385/9; 385/40; 385/130; 385/132
(58) Field of Classification Search .................. 385/129
See application file for complete search history.

(56) References Cited

U.S. PATENT DOCUMENTS

| | | | | |
|---|---|---|---|---|
| 5,710,847 A | * | 1/1998 | Takano et al. ................. 385/28 |
| 5,982,973 A | * | 11/1999 | Yan et al. ..................... 385/141 |
| 6,330,388 B1 | * | 12/2001 | Bendett et al. .............. 385/132 |
| 6,392,751 B1 | * | 5/2002 | Koch et al. ................... 356/478 |
| 6,574,381 B2 | * | 6/2003 | Stoddard et al. ............... 385/2 |
| 7,266,266 B2 | * | 9/2007 | Matsumoto ................... 385/27 |
| 2003/0039425 A1 | * | 2/2003 | Stoddard et al. ............... 385/2 |
| 2003/0039442 A1 | * | 2/2003 | Bond et al. ..................... 385/37 |
| 2007/0171515 A1 | * | 7/2007 | Kang et al. .................. 359/333 |

FOREIGN PATENT DOCUMENTS

JP    2004-328304 A    11/2004

\* cited by examiner

*Primary Examiner*—Frank G Font
*Assistant Examiner*—Mary A El Shammaa
(74) *Attorney, Agent, or Firm*—Sughrue Mion, PLLC

(57) ABSTRACT

An optical waveform shaping device includes a first waveguide portion, formed on a substrate, for transmitting the optical signal and simultaneously absorbing a portion of the optical signal, which has a signal level equal to or smaller than a predetermined value, so as to shape the optical signal; and a second waveguide portion, formed on the substrate, for transmitting the optical signal, which was transmitted through the first waveguide portion, and simultaneously amplifying the optical signal. The first waveguide portion may be formed using a saturable absorber. A first electrode for supplying electric current to the first waveguide portion so that the first waveguide portion is provided with a function of absorbing the optical signal; and a second electrode for supplying electric current to the second waveguide portion so that the second waveguide portion is provided with a function of amplifying the optical signal may also be provided.

8 Claims, 4 Drawing Sheets

TRANSMITTED ←→ ABSORBED  Th

OPTICAL WAVEFORM SHAPING DEVICE INCLUDING PORTIONS FOR RESPECTIVELY ABSORBING AND AMPLIFYING TRANSMITTED OPTICAL SIGNAL

Priority is claimed on Japanese Patent Application No. 2005-193546, filed Jul. 1, 2005, the content of which is incorporated herein by reference.

BACKGROUND OF THE INVENTION

1. Field of the Invention

The present invention relates to an optical waveform shaping device for shaping (or correcting) the waveform of an optical signal transmitted through a transmission path formed by an optical fiber or the like.

2. Description of the Related Art

In recent years, amounts of data transmitted or received have been greatly increasing in accordance with progress in data handling techniques. In order to transmit a vast amount of data, optical communications are more popularly used. Recently, optical fibers have been used, not only for basic or submarine transmission paths for transmitting optical signals over a long distance of a few hundred or a few thousand kilometers, but also for transmission paths for connecting firm offices or ordinary homes. A transmission path using optical fibers can reduce degradation of optical signals; however, degradation cannot be completely avoided. Therefore, when an optical signal is transmitted over a long distance, degradation of the optical signal occurs due to dispersion of each optical fiber, or the like.

Presently-available optical communication systems employ a dispersion-compensator for compensating dispersion of the optical fiber, or use optical fibers having improved performance or characteristics, so as to increase a possible transmission distance. However, such devices for increasing the transmission distance have their limits. In a recently-developed technique for further increasing the transmission distance, a waveform shaping process is performed before reproduction of the optical signal becomes impossible due to degradation of the signal. In the waveform shaping process, the optical signal transmitted through an optical fiber is once converted into an electrical signal and a waveform of the electrical signal is shaped (or corrected), and the electrical signal having the shaped waveform is again restored to an optical signal. This optical signal subjected to the waveform shaping process is transmitted through the optical fiber, thereby increasing the transmission distance. A detailed description of this technique may be found in Reference Document 1: Japanese Unexamined Patent Application, First Publication No. 2004-328304.

In the technique disclosed in Reference Document 1, the waveform shaping process is performed in which an optical signal, transmitted through an optical fiber, is once converted to an electrical signal, and the electrical signal is restored to an optical signal. In accordance with this process, the optical signal transmitted through the optical fiber can be restored to an optical signal before the transmission through the optical fiber.

However, in order to implement the waveform shaping process, expensive devices are necessary, such as a light source, an optical modulator, a light-receiving element enabling of high-speed operation, and high-speed digital and analog circuits, thereby increasing the cost relating to the entire transmission path. In addition, a device for implementing the waveform shaping process should be large-sized; thus, a problem may occur depending on the place where the device is installed.

SUMMARY OF THE INVENTION

In light of the above circumstances, an object of the present invention is to provide a small-sized and low-priced optical waveform shaping device.

Therefore, the present invention provides an optical waveform shaping device (10; 20) for shaping an optical signal, comprising:

a first waveguide portion (P12; P22), formed on a substrate (11; 21), for transmitting the optical signal and simultaneously absorbing a portion of the optical signal, which has a signal level equal to or smaller than a predetermined value, so as to shape the optical signal; and a second waveguide portion (P13; P23), formed on the substrate, for transmitting the optical signal, which was transmitted through the first waveguide portion, and simultaneously amplifying the optical signal.

In accordance with the above structure, An optical signal input into the first waveguide portion is transmitted through the first waveguide portion, and simultaneously, a portion of the optical signal, which has a signal level equal to or smaller than a predetermined value, is absorbed and thus the optical signal is shaped. This shaped optical signal is input into the second waveguide portion, and is transmitted and simultaneously amplified through the second waveguide portion.

In a preferable example, the first waveguide portion is formed using a saturable absorber, and the optical waveform shaping device further includes:

a first electrode (13b; 23b) for supplying electric current to the first waveguide portion so that the first waveguide portion is provided with a function of absorbing the optical signal; and a second electrode (13c; 23c) for supplying electric current to the second waveguide portion so that the second waveguide portion is provided with a function of amplifying the optical signal.

A plurality of sets of the first and the second waveguide portions may be provided in a transmitting direction of the optical signal. In this case, preferably, the first waveguide portions of said plurality of the sets have different values for said predetermined value compared with the signal level.

In a typical example, a quantum well is formed in at least one of the first and the second waveguide portions, in a direction perpendicular to a transmitting direction of the optical signal. In this case, preferably, the quantum well has a multiple quantum-well structure.

In another typical example, at least one of the first and the second waveguide portions is positioned between reflecting mirrors (24, 25), in a direction perpendicular to a transmitting direction of the optical signal. In this case, preferably, the reflecting mirrors are Bragg reflection mirrors.

In accordance with the present invention, the first waveguide portion for transmitting the optical signal and simultaneously absorbing a portion of the optical signal, which has a signal level equal to or smaller than a predetermined value, so as to shape the optical signal; and the second waveguide portion for transmitting the optical signal, which was transmitted through the first waveguide portion, and simultaneously amplifying the optical signal, are formed on the substrate. Therefore, it is possible to provide a small-sized and low-priced optical waveform shaping device.

DETAILED DESCRIPTION OF THE INVENTION

Hereinafter, embodiments of the optical waveform shaping device in accordance with the present invention will be described with reference to the appended figures. In the following explanations, an XYZ coordinate system may be defined in a figure depending on necessity, and positional relationships between members are explained with reference to the XYZ coordinate system.

First Embodiment

Figure 1:
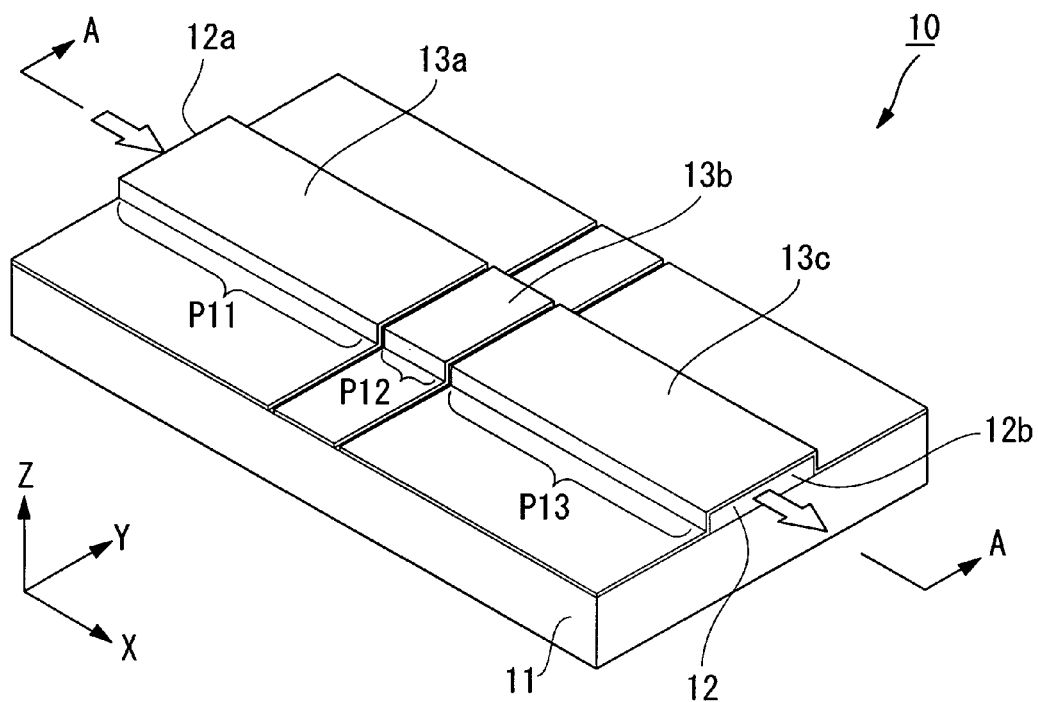
FIG. 1 is a perspective view showing an optical waveform shaping device as a first embodiment in accordance with the present invention.
Figure 2:
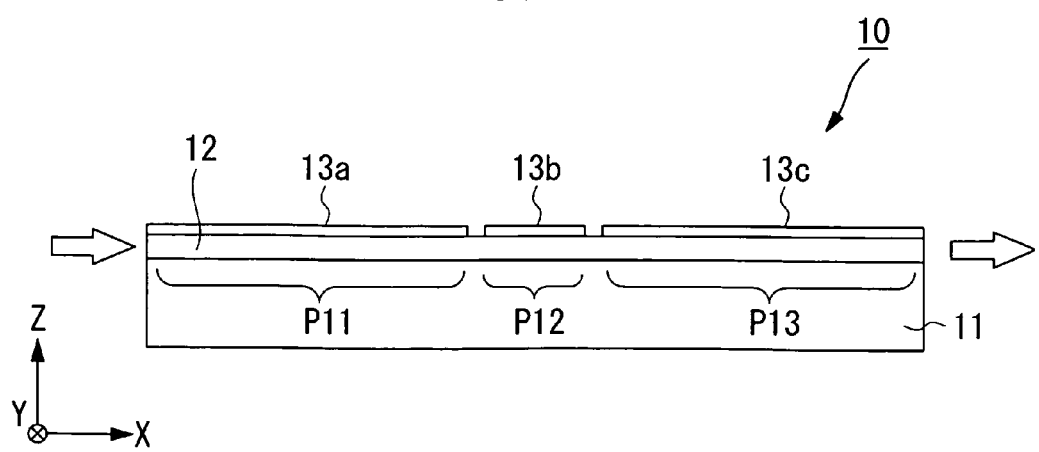
FIG. 2 is a sectional view along line A-A in FIG. 1.

FIG. 1 is a perspective view showing an optical waveform shaping device 10 as a first embodiment of the present invention. FIG. 2 is a sectional view along line A-A in FIG. 1.

As shown in FIGS. 1 and 2, the optical waveform shaping device 10 of the present embodiment has a waveguide 12 which is formed on a substrate 11 and extends along the X axis of the defined XYZ coordinate system, and electrodes 13a, 13b, and 13c, which are formed on the substrate 11 and the waveguide 12 and have a form of three-divided electrodes. An optical signal is input from an input end 12a (i.e., an end of the waveguide 12), subjected to waveform shaping using the waveguide 12, and then output from an output end 12b (i.e., the other end of the waveguide 12). In the present embodiment, the wavelength of each input optical signal is 1.55 μm, which is generally used in the communication field.

The waveguide 12 formed on the substrate 11 is designed in a manner such that an optical signal transmitted inside the waveguide 12 has a single mode. Specifically, the designed waveguide 12 is (i) approximately a few hundred μm to a few mm in length (i.e., along the X axis), (ii) approximately a few hundred μm in width (i.e., along the Y axis), and (iii) approximately a few μm in height (i.e., along the Z axis). The waveguide 12 is made of (i) a material (e.g., InP) which is almost transparent with respect to each input optical signal, and (ii) a material (e.g., InGaAsP) which generally absorbs the input optical signal, but amplifies the input optical signal due to (electric) current injection. These materials are alternately stacked along the height (i.e., the Z axis) of the waveguide 12.

The electrodes 13a, 13b, and 13c are made of a material which can establish ohmic contact to at least the materials of the waveguide 12. The length (i.e., along the X axis) of each of the electrodes 13a and 13c is approximately 100 μm to a few mm, and the length of the electrode 13b, provided between the electrodes 13a and 13c, is approximately 100 μm. In addition, a common electrode (not shown) is provided on the bottom face of the substrate 11 with respect to the electrodes 13a, 13b, and 13c. Electric current supplied from each of the electrodes 13a, 13b, and 13c is drawn into the common electrode via the waveguide 12 and the substrate 11.

A portion of the waveguide 12, on which the electrode 13a is formed, is called a waveguide portion P11, while another portion of the waveguide 12, on which the electrode 13c is formed, is called a waveguide portion P13. The portions P11 and P13 are provided for guiding (or transmitting) and simultaneously amplifying the optical signal. On the other hand, another portion of the waveguide 12, on which the electrode 13b is formed, is called a waveguide portion P12, and this portion is provided for guiding the optical signal and simultaneously absorbing a portion of the optical signal, which has a signal level equal to or smaller than a predetermined value, so as to shape (or correct) the waveform of the optical signal.

If the length (i.e., along the X axis) of the waveguide portion P12 is too long, it may be impossible to follow the modulation rate of the input optical signal. Therefore, the length of the waveguide portion P12 is approximately 100 μm or smaller so as to sufficiently follow the modulation rate of the input optical signal. The voltage applied to each of the electrodes 13a, 13b, and 13c can be freely set to a desired value, thereby supplying a desired amount of current to each of the waveguide portions P11, P12, and P13.

Due to control of the current supplied from each of the electrodes 13a, 13b, and 13c to the waveguide 12, it is possible to assign different functions to different portions of the waveguide which has the same material structure. That is, in a case in which a large current is supplied respectively from the electrodes 13a and 13c to the waveguide portions P11 and P13, when the optical signal is input into the waveguide portions P11 and P13, induced emission occurs inside the waveguide portions P11 and P13, so that the optical signal is amplified while passing through the waveguide portions P11 and P13. In this process, when the current supplied from the electrode 13b to the waveguide portion P12 is set to a specific value smaller than the current supplied to the waveguide portions P11 and P13, the waveguide portion P12 functions as a saturable absorber. The saturable absorber is an optical absorption material which becomes transparent when the intensity of input light increases, that is, it has a weaker light-absorbing performance when absorbed light is saturated. Due to the optical absorption material, a portion of the optical signal, whose level is equal to or smaller than a predetermined value, can be absorbed.

FIGS. 3A to 3D are diagrams showing examples of the waveform of the optical signal transmitted through the waveguide 12. The waveform shown in each figure is an eye pattern obtained by converting the optical signal transmitted through the waveguide 12 to an electrical signal, which is displayed using an oscilloscope, or the like. As is well known, the eye pattern observed using an oscilloscope consists of eye-like patterns. When the eye pattern has clear eye shapes and is noiseless, and upper and lower portions of the waveform are almost symmetrical, the relevant optical signal has less degradation.

Figure 3A:
FIGS. 3A to 3D are diagrams showing examples of the waveform of the optical signal transmitted through the waveguide 12.
Figure 3B:
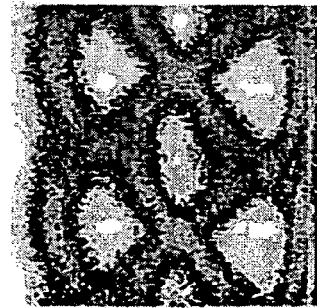

FIG. 3A shows an eye pattern of an optical signal input into the input end 12a of the waveguide 12, and FIG. 3B shows an eye pattern of an optical signal output from the waveguide portion P11 (i.e., input into the waveguide portion P12). In addition, FIG. 3C shows an eye pattern of an optical signal output from the waveguide portion P12 (i.e., input into the waveguide portion P13), and FIG. 3D shows an eye pattern of an optical signal output from the output end 12b.

With reference to FIG. 3A, the eye pattern of the optical signal input into the input end 12a of the waveguide 12 does not have clear eye shapes while upper and lower portions of the waveform are almost symmetrical. This means that the optical signal has been degraded. When this signal is amplified while passing through the waveguide portion P11, the eye pattern shown in FIG. 3B is obtained. In the waveguide portion P11, the degraded optical signal is simply amplified; thus, in the eye pattern of the optical signal output from the waveguide portion P11 (see FIG. 3B), eye shapes are still not clear while upper and lower portions of the waveform are almost symmetrical. The above amplification (at the waveguide portion P11) of the optical signal input from the input end 12a is performed so as to make the waveform shaping performed at the waveguide portion P12 easier.

Figure 3C:
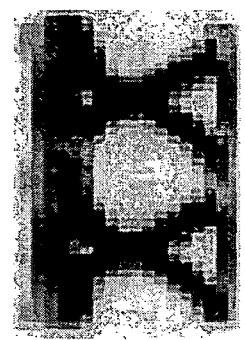

After the optical signal output from the waveguide portion P11 is input into the waveguide portion P12, a portion of the optical signal, whose level is equal to or smaller than a threshold Th, is absorbed (see FIG. 3B), thereby obtaining the eye pattern shown in FIG. 3C. The threshold is set to a value between level "1" and level "0" of the optical signal input into the waveguide portion P12, in accordance with a relationship between the gain of the waveguide portion P11 and the current applied to the waveguide portion P12. With reference to FIG. 3C, in accordance with the absorption using the waveguide portion P11, the size of each eye portion is increased and each eye portion is clearer, although the signal level itself is lower.

Figure 3D:
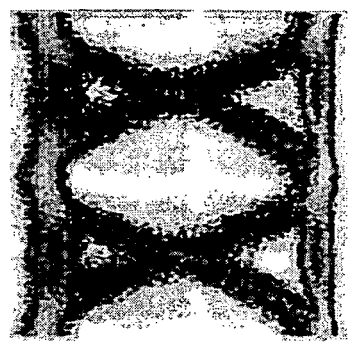

After the optical signal output from the waveguide portion P12 is input into the waveguide portion P13, the optical signal is amplified while being transmitted through the waveguide portion P13, thereby obtaining the eye pattern shown in FIG. 3D. With reference to FIG. 3D, the signal level is sufficiently large, noise is not included, eye shapes are clear, and upper and lower portions are almost symmetrical.

As explained above, the size of the optical waveform shaping device 10 is a few mm square at largest, and the device 10 is not so expensive. In addition, the degraded optical signal can be preferably shaped or corrected.

Second Embodiment

Figure 4:
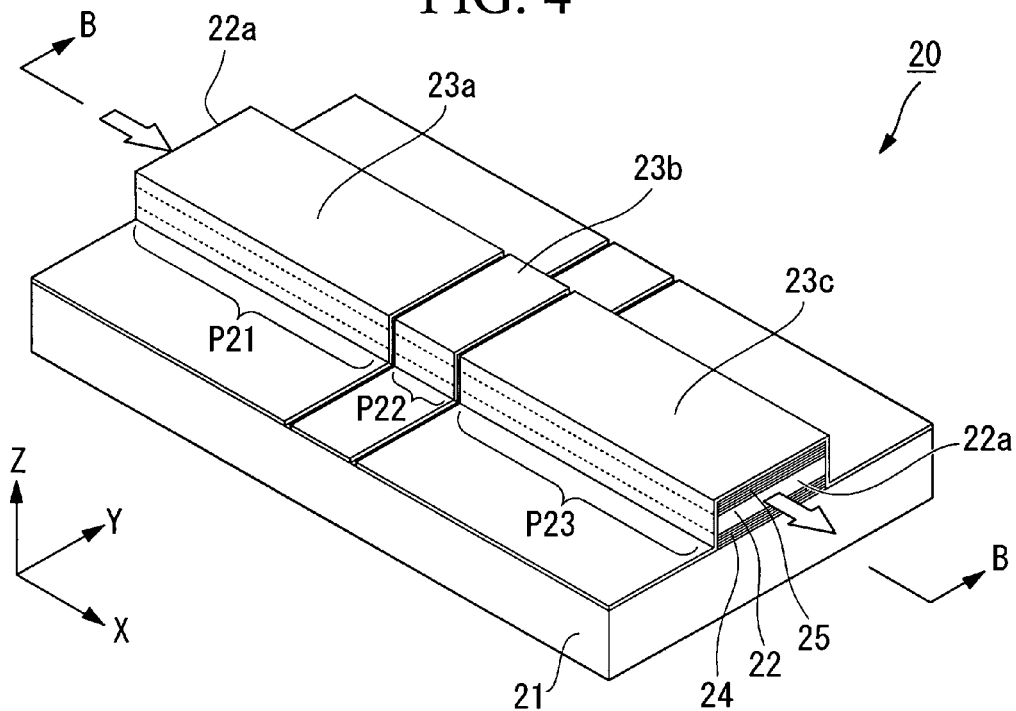
FIG. 4 is a perspective view showing an optical waveform shaping device as a second embodiment in accordance with the present invention.
Figure 5:
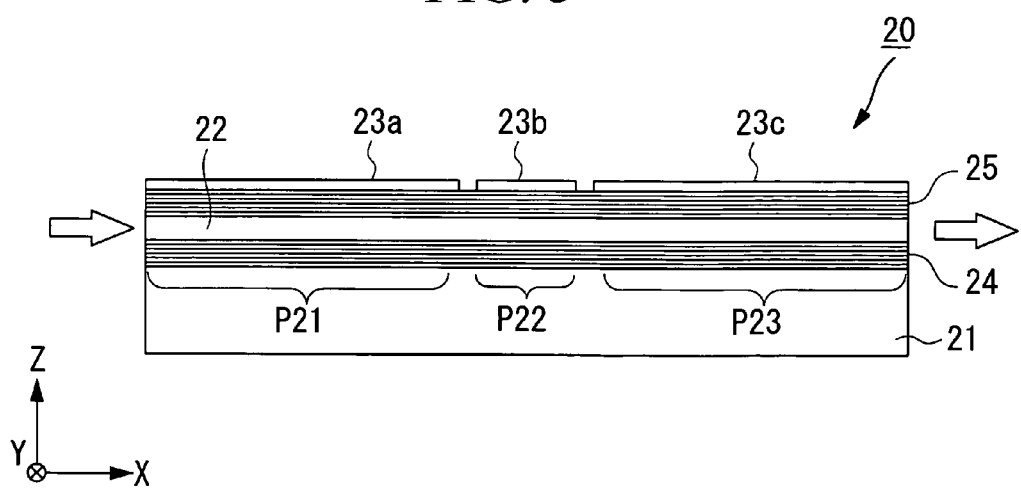
FIG. 5 is a sectional view along line B-B in FIG. 4.

FIG. 4 is a perspective view showing an optical waveform shaping device 20 as a second embodiment in accordance with the present invention. FIG. 5 is a sectional view along line B-B in FIG. 4.

As shown in FIGS. 4 and 5, the optical waveform shaping device 20 of the present embodiment has a reflecting mirror 24 (e.g., a Bragg reflection mirror) formed on a substrate 21, a waveguide 22, a reflecting mirror 25 (e.g., a Bragg reflection mirror), and electrodes 23a, 23b, and 23c, which are formed so as to cover the above mirrors and the waveguide and have a form of three-divided electrodes.

Similarly to in the first embodiment, the waveguide 22 extends along the X axis, and is made of (i) a material (e.g., InP) which is almost transparent with respect to each input optical signal (having a wavelength of 1.55 μm), and (ii) a material (e.g., InGaAsP) which generally absorbs the input optical signal, but amplifies the input optical signal due to (electric) current injection. These materials are alternately stacked along the height (i.e., the Z axis) of the waveguide 22. Also similarly to in the first embodiment, the waveguide 22 is designed in a manner such that an optical signal transmitted inside the waveguide 22 has a single mode. An optical signal is input from an input end 22a (i.e., an end of the waveguide 22), subjected to waveform shaping using the waveguide 22, and then output from an output end 22b (i.e., the other end of the waveguide 22).

The reflecting mirror 24 is formed on a bottom face (i.e., −Z (axis) side) of the waveguide 22, while the reflecting mirror 25 is formed on an upper face (i.e., +Z (axis) side) of the waveguide 22. That is, the reflecting mirrors 24 and 25 are formed in a manner such that the waveguide 22 is positioned between the reflecting mirrors 24 and 25 along the Z axis. In other words, the waveguide 22 is disposed in a resonator consisting of the reflecting mirrors 24 and 25. The reflecting mirrors 24 and 25 are provided for inducing laser oscillation along the Z axis, so as to improve operational responsivity of amplification to an optical signal which is input along the X axis.

When the reflecting mirror 25 is made of an electrically conductive material, the electrodes 23a, 23b, and 23c are made of a material which can establish ohmic contact to at least the material of the reflecting mirror 25.

The length (i.e., along the X axis) of each of the electrodes 23a and 23c is similar to the length (along the X axis) of the electrodes 13a and 13c shown in FIGS. 1 and 2, that is, approximately 100 μm to a few mm, and the length of the electrode 23b is similar to the length (along the X axis) of the electrode 13b shown in FIGS. 1 and 2, that is, approximately 100 μm. Similarly to in the first embodiment, a common electrode (not shown) is formed on the bottom face of the substrate 21.

Also similarly to in the first embodiment, a portion of the waveguide 22, on which the electrode 23a is formed, is called a waveguide portion P21, while another portion of the waveguide 22, on which the electrode 23c is formed, is called a waveguide portion P23. The portions P21 and P23 are provided for guiding (or transmitting) and simultaneously amplifying the optical signal. On the other hand, another portion of the waveguide 22, on which the electrode 23b is formed, is called a waveguide portion P22, and this portion is provided for guiding the optical signal and simultaneously absorbing a portion of the optical signal, which has a signal level equal to or smaller than a predetermined value, so as to shape (or correct) the waveform of the optical signal. Also in the present embodiment, the amount of current supplied from each of the electrodes 23a, 23b, and 23c is controlled so that the waveguide portions P21, P22, and P23 respectively have the above-described functions.

When an optical signal is input into the optical waveform shaping device 20 having the above-described structure, the optical signal is first amplified in the waveguide portion P21. After that, a portion of the optical signal, whose level is equal to or smaller than a predetermined value, is absorbed in the waveguide portion P22 so as to shape the waveform of the optical signal. The optical signal having the shaped waveform is then amplified in the waveguide portion P23. Therefore, similarly to in the first embodiment, even when the input optical signal has been degraded, the waveform of the optical signal can be preferably shaped or corrected. In addition, in the present embodiment, when the optical signal is transmitted through the waveguide 22, laser oscillation along the Z axis occurs due to the resonator consisting of the reflecting mirrors 24 and 25, thereby improving the response speed. Therefore, even when an optical signal having a high modulation speed (i.e., having a high modulation frequency) is input, waveform shaping can be preferably performed.

In the structure shown in FIGS. 4 and 5, the waveguide 22 is provided between the reflecting mirrors 24 and 25 along the Z axis, and electrodes 23a, 23b, and 23c are formed on the reflecting mirror 25. However, when the reflecting mirrors 24 and 25 are Bragg reflection mirrors, a dielectric multilayer film using SiO2/TiO2 (i.e., an insulating material) is preferably used. That is, in the case of using such a material for forming the reflecting mirrors 24 and 25, current cannot be supplied to the waveguide 22 even though the electrodes 23a, 23b, and 23c are formed on the reflecting mirror 25. Therefore, when the reflecting mirrors 24 and 25 are formed using dielectric multilayer films, it is preferable to form (i) the electrodes 23a, 23b, and 23c between the waveguide 22 and the reflecting mirror 25, and (ii) a common electrode between the waveguide 22 and the reflecting mirror 24.

Additionally, in the above description relating to the structure shown in FIGS. 4 and 5, both the reflecting mirrors 24 and 25 may be Bragg reflection mirrors. However, one of the reflecting mirrors 24 and 25 may be a Bragg reflection mirror, and the other is a metal reflection mirror. Also in the structure shown in FIGS. 4 and 5, the reflecting mirrors 24 and 25 are formed over the whole length of the waveguide 22 along the X axis. However, the reflecting mirrors 24 and 25 may be formed so that one or two of the waveguide portions P21, P22, and P23 are positioned between the reflecting mirrors 24 and 25. For example, only the waveguide portion P22, or the waveguide portions P21 and P23 are positioned between the reflecting mirrors 24 and 25.

Other Embodiments

In the above-described first embodiment, the waveguide 12 on the substrate 111 extends along the X axis, and the waveguide portions P11, P12, and P13 have the same structure. Also in the second embodiment, the waveguide 22 on the substrate 21 extends along the X axis, and the waveguide portions P21, P22, and P23 have the same structure. However, the waveguide portions P11, P12, and P13, or the waveguide portions P21, P22, and P23 may have different structures from each other. For example, a quantum well may be formed so as to improve an amplification efficiency or an absorption efficiency of the optical signal. In this case, a multiple quantum-well structure is preferable.

Figure 6:
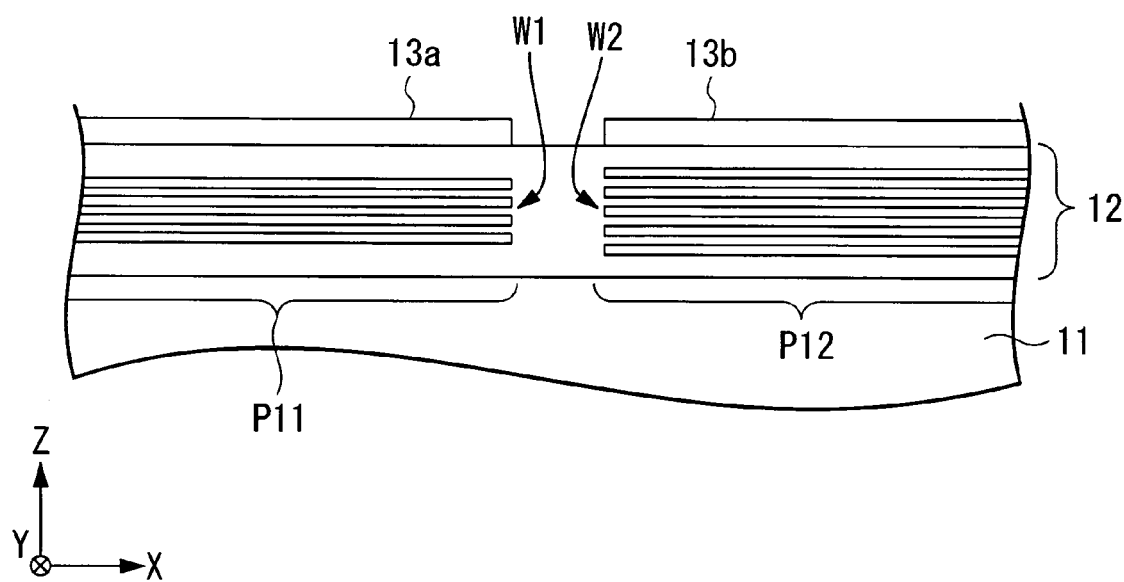
FIG. 6 is a sectional view showing an example in which multiple quantum wells are formed in the waveguide 11 of the optical waveform shaping device 10 of the first embodiment.

FIG. 6 is a sectional view showing an example in which multiple quantum wells are formed in the waveguide 11 of the optical waveform shaping device 10 of the first embodiment. In the example of FIG. 6, multiple quantum-well structures W1 and W2 having different structures are respectively formed in the waveguide portions P11 and P12. The multiple quantum-well structure W1 formed in the waveguide portion P11 is designed so as to improve the amplification efficiency, while the multiple quantum-well structure W2 formed in the waveguide portion P12 is designed so as to improve the absorption efficiency.

When the waveguide 11 is made of InP, the multiple quantum-well structures W1 and W2 are made of $InP/I_{1-x}Ga_{x-}AS_xP_{1-y}$. In addition, when the multiple quantum-well structures W1 and W2 have different structures, (i) the thickness of each layer or the number of layers which form each multiple quantum-well structure, or (ii) the composition with respect to "$In_{1-x}Ga_xAS_xP_{1-y}$" may be adjusted so that the multiple quantum-well structures W1 and W2 have different conditions.

In addition, in the first embodiment, the waveguide portions P11, P12, and p13 are provided along the X axis of the waveguide 11, and in the second embodiment, the waveguide portions P21, P22, and p23 are provided along the X axis of the waveguide 21. However, in these embodiments, the waveguide portions P11 and P21 can be omitted while amplification performed in these portions is performed using an external device.

In another variation, a plurality of sets of the waveguide portion P12 for shaping the waveform of the optical signal and the waveguide portion P13 for amplifying the optical signal, or a plurality of sets of the waveguide portion P22 for shaping the waveform of the optical signal and the waveguide portion P23 for amplifying the optical signal, may be provided in the transmission direction of the optical signal (i.e., along the X axis). In such a structure, the number of processing steps of amplification or absorption (or waveform shaping) can be changed in accordance with a degree of degradation of the optical signal, by controlling current flowing through each waveguide portion. In this case, preferably, the threshold levels (i.e., levels Th in FIG. 3B) of the waveguide portions P12 (respectively assigned to the processing steps), each for performing waveform shaping of the optical signal, have different values. In addition, when a plurality of sets of the waveguide portion for shaping the waveform of the optical signal and the waveguide portion for amplifying the optical signal are provided, control for determining whether the waveform shaping is performed is possible by integrating devices such as optical switches, optical branch paths, or the like.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An optical waveform shaping device for shaping an optical signal, comprising:
    a first waveguide portion, formed on a substrate, for transmitting the optical signal and simultaneously absorbing a portion of the optical signal, which has a signal level equal to or smaller than a predetermined value, so as to shape the optical signal; and
    a second waveguide portion, formed on the substrate, for transmitting the optical signal, which was transmitted through the first waveguide portion, and simultaneously amplifying the optical signal.

2. The optical waveform shaping device in accordance with claim 1, wherein the first waveguide portion is formed using a saturable absorber, and the optical waveform shaping device further comprises:
    a first electrode for supplying electric current to the first waveguide portion so that the first waveguide portion is provided with a function of absorbing the optical signal; and
    a second electrode for supplying electric current to the second waveguide portion so that the second waveguide portion is provided with a function of amplifying the optical signal.

3. The optical waveform shaping device in accordance with claim 1, wherein a plurality of sets of the first and the second waveguide portions are provided in a transmitting direction of the optical signal.

4. The optical waveform shaping device in accordance with claim 3, wherein the first waveguide portions of said plurality of the sets have different values for said predetermined value compared with the signal level.

5. The optical waveform shaping device in accordance with claim 1, wherein a quantum well is formed in at least one of the first and the second waveguide portions, in a direction perpendicular to a transmitting direction of the optical signal.

6. The optical waveform shaping device in accordance with claim 5, wherein the quantum well has a multiple quantum-well structure.

7. The optical waveform shaping device in accordance with claim 1, wherein at least one of the first and the second waveguide portions is positioned between reflecting mirrors, in a direction perpendicular to a transmitting direction of the optical signal.

8. The optical waveform shaping device in accordance with claim 7, wherein the reflecting mirrors are Bragg reflection mirrors.

* * * * *